(12) United States Patent
Lee et al.

(10) Patent No.: US 7,952,907 B2
(45) Date of Patent: May 31, 2011

(54) FERROELECTRIC RANDOM ACCESS MEMORY DEVICE

(75) Inventors: Eun-Sun Lee, Yongin-si (KR);
Young-Min Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 12/378,754

(22) Filed: Feb. 19, 2009

(65) Prior Publication Data
US 2009/0213637 A1    Aug. 27, 2009

(30) Foreign Application Priority Data

Feb. 21, 2008   (KR) .................. 10-2008-0015907

(51) Int. Cl.
*G11C 11/22*   (2006.01)
*G11C 11/24*   (2006.01)
*H01L 21/02*   (2006.01)

(52) U.S. Cl. .................. 365/145; 365/149; 257/295

(58) Field of Classification Search .................. 365/145
See application file for complete search history.

(56) References Cited

U.S. PATENT DOCUMENTS

| | | | | |
|---|---|---|---|---|
| 5,414,654 A | * | 5/1995 | Kubota et al. | 365/145 |
| 5,838,036 A | * | 11/1998 | Mori | 257/296 |
| 6,028,784 A | * | 2/2000 | Mori et al. | 365/145 |
| 6,151,243 A | * | 11/2000 | Kim | 365/145 |
| 6,353,550 B1 | * | 3/2002 | Hirano | 365/145 |
| 6,587,367 B1 | * | 7/2003 | Nishimura et al. | 365/145 |
| 6,828,612 B2 | * | 12/2004 | Miyatake et al. | 257/296 |
| 6,967,365 B2 | * | 11/2005 | Summerfelt et al. | 257/295 |
| 7,045,834 B2 | * | 5/2006 | Tran et al. | 257/208 |
| 7,139,184 B2 | * | 11/2006 | Schloesser | 365/53 |
| 7,426,130 B2 | * | 9/2008 | Jeon | 365/145 |
| 7,642,572 B2 | * | 1/2010 | Popp et al. | 257/211 |
| 2005/0087787 A1 | | 4/2005 | Ando | |

FOREIGN PATENT DOCUMENTS

| | | |
|---|---|---|
| JP | 2005-129794 | 5/2005 |
| KR | 10-0291182 | 3/2001 |
| KR | 10-0476397 | 3/2005 |

\* cited by examiner

*Primary Examiner* — Son L Mai
(74) *Attorney, Agent, or Firm* — Mills & Onello, LLP

(57) ABSTRACT

An FRAM device includes first ferroelectric capacitors, second ferroelectric capacitors, first plate lines and second plate lines. The first ferroelectric capacitors can be connected between word lines and bit lines. The second ferroelectric capacitors can be connected between the word lines and bit line bars. The first plate lines can be connected to upper electrodes of the first ferroelectric capacitors. The second plate lines can be connected to upper electrodes of the second ferroelectric capacitors. Thus, the first ferroelectric capacitors connected to the bit lines and the second ferroelectric capacitors connected to the bit line bars can be connected to the different plate lines, so that data can be output from any one of the bit line and the bit line bar. As a result, a layout of a core region can be simplified.

8 Claims, 5 Drawing Sheets

FIRST DIRECTION

SECOND DIRECTION

FERROELECTRIC RANDOM ACCESS MEMORY DEVICE

RELATED APPLICATIONS

This application claims priority under 35 USC §119 to Korean Patent Application No. 10-2008-0015907, filed on Feb. 21, 2008 in the Korean Intellectual Property Office (KIPO), the contents of which are herein incorporated by reference in their entirety.

BACKGROUND

1. Field

Embodiments are directed to ferroelectric random access memory (FeRAM or FRAM) devices and methods of manufacturing the same. More particularly, example embodiments described herein relate to a ferroelectric random access memory device including a ferroelectric capacitor, and a method of manufacturing the ferroelectric random access memory device.

2. Description of the Related Art

Generally, a volatile memory device such as a dynamic random access memory (DRAM) device, a static random access memory (SRAM) device, etc., can lose stored data when power is removed from the volatile memory device. In contrast, a non-volatile memory device such as an electrically programmable read-only memory (EPROM), an electrically erasable programmable read-only memory (EEPROM) device, a flash EEPROM memory device, etc., does not lose data when a power is not applied to the non-volatile memory device. Thus, the non-volatile memory device can be widely used. However, the volatile memory device can be limited in application, because it is necessary to continuously apply a power to the volatile memory device in order for the volatile memory device to store data. Further, non-volatile memory devices often have a low degree of integration, a slow operational speed, and requires a high voltage, etc.

Therefore, in order to solve the abovementioned problems, a semiconductor memory device including a ferroelectric material has been widely considered because this device provides beneficial features of both volatile memory devices and non-volatile memory devices. In particular, a ferroelectric capacitor can be combined with an access transistor, a bit line, and a plate line to form a memory cell Generally, the ferroelectric material can correspond to a non-linear dielectric material that can exhibit a hysteresis loop in accordance with an electric field caused by a dielectric polarization. A ferroelectric random access memory (FRAM) device comprising the ferroelectric material can possess features of a non-volatile memory device due to the dielectric polarization characteristics of the ferroelectric material.

Thus, the FRAM device can have a structure including the ferroelectric material in place of a conventional dielectric layer of a DRAM device. However, the FRAM device can be used as a memory device by applying a voltage to the ferroelectric material to change the polarization of the ferroelectric material. Thus, upper electrodes of the FRAM device are generally configured to receive the voltage via a plate line. For this reason, the upper electrodes of capacitors in the FRAM device are electrically connected to plate lines.

In the FRAM device, a memory cell must be sensed to determine the corresponding bit setting in the memory cell. However, methods of sensing cells can be different from each other in accordance with arrangement structures of bit lines.

The arrangement structures of the bit lines in the FRAM device can be classified into a folded bit line structure and an open bit line structure.

The folded bit line structure can include a bit line and a bit line bar in parallel with each other. In the FRAM device having the folded bit line structure, when a selected single word line is operated, cells can be operated one by one in a direction of extension of the bit line. Particularly, when the selected word line is activated, data in the cell can be output from a bit line connected to the selected word line. The data can be compared with data in a bit line bar adjacent and parallel to the bit line in order to sense the data in the cell. Therefore, because a single core sense amplifier is connected to both the bit line and the adjacent bit line bar to perform the comparison, an area where the core sense amplifier is formed can be sufficiently ensured in a core region, i.e., a region that includes the memory cells.

However, the folded bit line structure can include two word lines in a region where a single cell can be formed. That is, the two word lines can be arranged in a central portion and an edge portion of an active region where a unit cell can be formed. Thus, a parasitic capacitance between the bit line and the word line can be significantly increased. The increased parasitic capacitance can cause a difference between a noise signal of an output signal and a noise signal of the parasitic capacitance, so that a sensing margin does not effectively discriminate between states of the data of the selected cell, i.e., between a programmed cell and an erased cell. Particularly, when forming a highly integrated FRAM device, the parasitic capacitance can have a greater influence on the highly integrated FRAM device. As a result, the highly integrated FRAM device can have frequent malfunctions and complicated designs.

In contrast, the open bit line structure can include a bit line and a bit line bar arranged at both sides of a sense amplifier in a core region. Particularly, in a FRAM device having the open bit line structure, when a selected single word line can be operated, all of the cells can be operated in a direction of extension of the bit line. That is, when the selected word line is activated, data in a given cell can be output from both the bit line and the bit line bar connected to the selected word line. Thus, the data output from the bit line can be compared with the data output from the bit line bar arranged in an opposite sector to sense the data in the cell output from the bit line. Further, the data output from the bit line bar can be compared with the data output from the bit line arranged in an opposite sector to sense the data in the cell output from the bit line bar. Therefore, because two core sense amplifiers are provided to the bit line and the bit line bar, respectively, due to their locations in two different sectors, an area where the core sense amplifiers are formed cannot be sufficiently ensured in the core region. Further, because electrical environments between the bit line and the bit line bar connected to the two different core sense amplifiers can be different from each other, signals amplified by the core sense amplifiers can not reliably provide high sensitivity.

However, the FRAM device having the open bit line structure can include relatively more cells in an area compared to those in the FRAM device having the folded bit lint structure. Further, when the FRAM device having the open bit line structure and the FRAM device having the folded bit line structure can include equal numbers of cells in a substantially the same area, the FRAM device having the open bit line structure can have a relatively wide interval between the word lines and a relatively wide interval between the bit lines compared to the those of the FRAM device having the folded bit line structure. Therefore, the FRAM device having the open bit line structure can have a low parasitic capacitance between the bit lines. As a result, the FRAM device having the open bit line structure can have a relatively increased sensing margin compared to that of the FRAM device having the folded bit line structure notwithstanding the abovementioned disadvantages associated with comparisons made between data being output from a bit line and a bit line bar in different sectors.

SUMMARY

Example embodiments provide a ferroelectric random access memory (FRAM) device that can have a sufficient sensing margin and a sufficient area in a core region where a sense amplifier can be formed.

Example embodiments also provide a method of manufacturing the abovementioned FRAM device.

According to some example embodiments, there is provided a FRAM device. The FRAM device can comprise a plurality of first ferroelectric capacitors, a plurality of second ferroelectric capacitors, first plate lines and second plate lines. The first plurality of ferroelectric capacitors can be connected between word lines and bit lines. The plurality of second ferroelectric capacitors can be connected between the word lines and bit line bars. The first plate lines can be connected to upper electrodes of the first ferroelectric capacitors. The second plate lines can be connected to upper electrodes of the second ferroelectric capacitors.

In an example embodiment, the bit lines and the bit line bars can be alternately arranged.

In an example embodiment, cell selection transistor can be connected between the word lines and the bit lines, and between the word lines and the bit line bars. The word lines can be used as gate electrodes of the cell selection transistors.

In an example embodiment, the first ferroelectric capacitors and the second ferroelectric capacitors can be connected to drain regions of the cell selection transistors. The bit lines and the bit line bars can be connected to source regions of the cell selection transistors.

In an example embodiment, the first plate lines and the second plate lines can extend in a linear direction that is parallel to an extending direction of the word lines. Each of the first plate lines and the second plate lines can be arranged between the word lines.

In an example embodiment, at least one sense amplifier can be connected to the bit line and the bit line bar adjacent to each other.

According to some example embodiments, there is provided a FRAM device. The FRAM device can include first active regions, second active regions, word lines, bit lines, bit line bars, first ferroelectric capacitors, second ferroelectric capacitors, first plate lines and second plate lines. The first active regions can be arranged in an odd row on a substrate at a first angle with respect to a first direction. Further, each first active region can have a shape defined by isolation regions adjacent the first active regions. The second active regions can be arranged on the substrate between the first active regions. The second active regions can be arranged in an even row at the first angle with respect to the first direction. Further, each second active region can have a shape defined by isolation regions adjacent the second active regions. Each word lines can extend along the first direction on the first active regions and the second regions. The bit lines can cross central portions of the first active regions along a second direction that is substantially perpendicular to the first direction. The bit line bars can cross central portions of the second active regions along the second direction. The first ferroelectric capacitors can be connected between the word lines and the bit lines. The second ferroelectric capacitors can be connected between the word lines and the bit line bars. The first plate lines can be connected to upper electrodes of the first ferroelectric capacitors. Further, the first plate lines can be arranged between the word lines. The second plate lines can be connected to upper electrodes of the second ferroelectric capacitors. Further, the second plate lines can be arranged between the word lines.

In an example embodiment, the FRAM device can further include a first insulating interlayer configured to cover the word lines, and a second insulating interlayer configured to cover the bit lines and the bit line bars.

In an example embodiment, source/drain regions can be formed in surfaces of the first active regions and the second active regions at both sides of the word lines. The word lines can be used as gate electrodes of cell selection transistors.

In an example embodiment, first contact plugs can be arranged on the central portions of the first active regions and the second active regions between the word lines. The first contact plugs can be connected to the bit lines and the bit line bars. Second contact plugs can be arranged on edge portions of the first active regions and the second active regions at both sides of the word lines. The second contact plugs can be connected to the first ferroelectric capacitors and the second ferroelectric capacitors.

In an example embodiment, the first plate lines and the second plate lines can have a linear shape extending along the first direction.

In an example embodiment, at least one sense amplifier can be connected to one bit line and one bit line bar that are adjacent each other.

According to some example embodiments, there is provided a method of manufacturing a FRAM device. In the method of manufacturing the FRAM device, first active regions and second active regions can be formed on a substrate. The first active regions can be arranged in an odd row at a first angle with respect to a first direction. Further, the first active regions can have a shape defined by isolation regions adjacent the first active regions. The second active regions can be arranged between the first active regions. The second active regions can be arranged in an even row at the first angle with respect to the first direction. Further, the second active regions can have a shape defined by isolation regions adjacent the second active regions. The word lines can extend on the first active regions and the second regions, respectively, along the first direction. Each word line can be located in each of the first and second active regions. Bit lines can be formed to cross central portions of the first active regions along a second direction substantially perpendicular to the first direction. Bit line bars can be formed to cross central portions of the second active regions in the second direction. The first ferroelectric capacitors can be connected between the word lines and the bit lines. The second ferroelectric capacitors can be connected between the word lines and the bit line bars. The first plate lines can be connected to upper electrodes of the first ferroelectric capacitors. Further, the first plate lines can be arranged between the word lines. The second plate lines can be connected to upper electrodes of the second ferroelectric capacitors. Further, the second plate lines can be arranged between the word lines.

In an example embodiment, the method can further include covering the word lines with a first insulating interlayer, and covering the bit lines and the bit line bars with a second insulating interlayer.

In an example embodiment, impurities can be implanted into surfaces of the first active regions and the second active regions at both sides of the word lines to form source/drain regions.

In an example embodiment, first contact plugs can be formed on the central portions of the first active regions and the second active regions between the word lines. The first contact plugs can be connected to the bit lines and the bit line bars. Second contact plugs can be formed on edge portions of the first active regions and the second active regions at both sides of the word lines. The second contact plugs can be connected to the first ferroelectric capacitors and the second ferroelectric capacitors.

In an example embodiment, the first plate lines and the second plate lines can have a linear shape extending along the first direction.

In an example embodiment, at least one sense amplifier can be connected between the bit line and the bit line bar.

According to some example embodiments, the first ferroelectric capacitors connected to the bit lines and the second ferroelectric capacitors connected to the bit line bars can be connected to different plate lines. Thus, when a reading operation can be performed by selecting the word line and the plate line, data can be output from any one of the bit line and the bit line bar. Therefore, it can not be required to provide the bit line and the bit line bar with two sense amplifier, so that a layout of a core region can be simplified. Further, because the word lines in a unit cell can be small in number and an interval between conductive patterns in the unit cell can be wide, the FRAM device can have a low parasitic capacitance generated from the unit cell. Thus, a sufficient data sensing margin in the cell can be ensured.

BRIEF DESCRIPTION OF THE DRAWINGS

Example embodiments will be more clearly understood from the following detailed description taken in conjunction with the accompanying drawings. The drawings are not necessarily to scale, emphasis instead being placed upon illustrating the principles of the invention.

FIG. 1 is a circuit diagram illustrating a FRAM device in accordance with some example embodiments;

FIG. 2 is a plan view illustrating a FRAM device in accordance with some example embodiments;

FIG. 3 is a cross-sectional view illustrating a FRAM device in accordance with some example embodiments; and FIGS. 4 to 8 are cross-sectional views illustrating a method of manufacturing a FRAM device in accordance with some example embodiments.

DETAILED DESCRIPTION OF THE EMBODIMENTS

Figure 1:
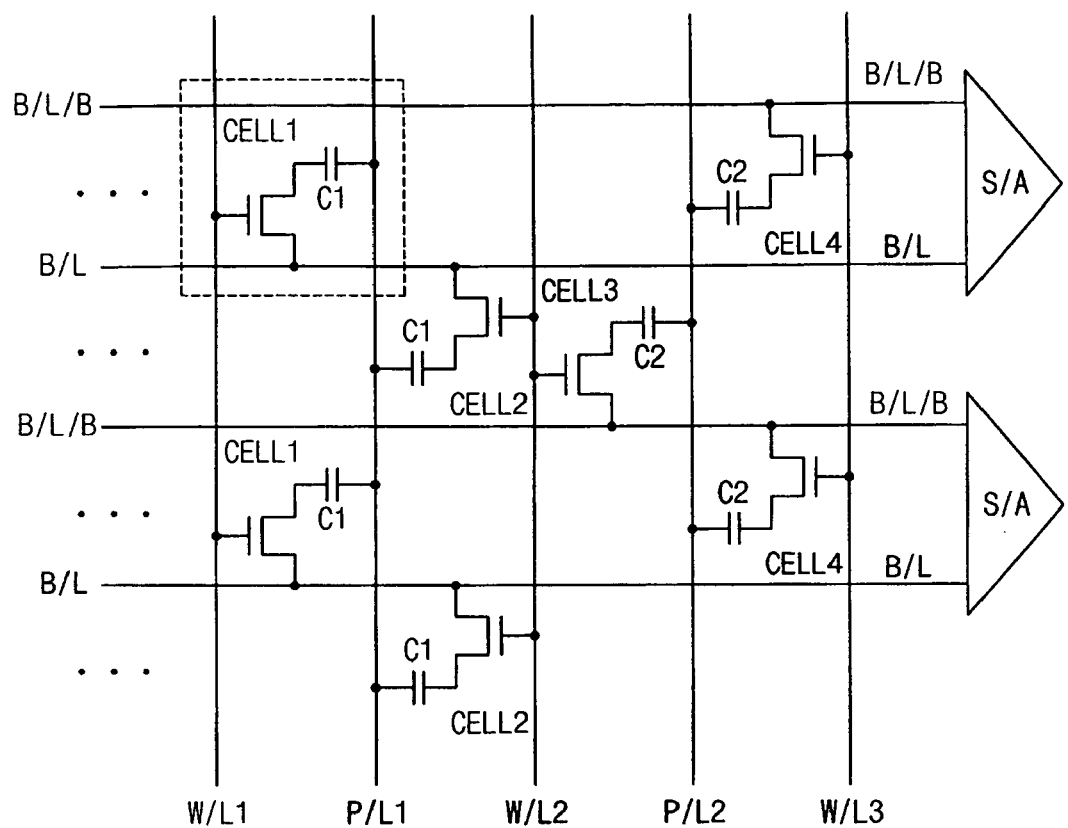
FIGS. 1 to 8 represent non-limiting, example embodiments as described herein.

Various example embodiments will be described more fully hereinafter with reference to the accompanying drawings, in which some example embodiments are shown. The present invention can, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions can be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a circuit diagram illustrating a FRAM device in accordance with some example embodiments.

Referring to FIG. 1, word lines W/L1, W/L2 and W/L3 can extend in a first direction. Further, the word lines W/L1, W/L2 and W/L3 can be arranged to be in parallel with each other. In this example embodiment, the word lines W/L1, W/L2 and W/L3 can be referred to as a first word line W/L1, a second word line W/L2 and a third word line W/L3.

Bit lines B/L and bit line bars B/L/B can extend in a second direction substantially perpendicular to the first direction. Further, the bit lines B/L and the bit line bars B/L/B can be alternately arranged.

Unit cells of a ferroelectric memory device can be arranged between the word lines W/L1, W/L2 and W/L3 and the bit lines B/L, and between the word lines W/L1. W/L2 and W/L3 and the bit line bars B/L/B. Each of the unit cells of the ferroelectric memory device can include a selection transistor and a ferroelectric memory element, for example, a capacitor. Hereinafter, the unit cells of the ferroelectric memory device can be illustrated in detail.

First cells CELL1 can be arranged between the first word line W/L1 and the bit line B/L. Each of the first cells CELL1 can include a first cell selection transistor and a first ferroelectric capacitor C1. The first cells CELL1 can be repeatedly arranged along the first word line W/L1.

In this example embodiment, the first word line W/L1 can be electrically connected to a gate electrode of the first cell selection transistor. Thus, the first word line W/L1 can be used as the gate electrode of the first cell selection transistor. The bit line B/L can be electrically connected to a source region of the first cell selection transistor. Further, a lower electrode of the first ferroelectric capacitor C1 can be electrically connected to a drain region of the first cell selection transistor. In an embodiment, the first ferroelectric capacitor C1 can include the lower electrode, a ferroelectric layer pattern, and the upper electrode.

A plurality of second cells CELL2 can be arranged between the second word line W/L2 adjacent the first word line W/L1 and the bit line B/L. In an embodiment, a first cell CELL1 and a second cell CELL2 are coupled to the same bit line B/L. In another embodiment, a first cell CELL1 and a second cell CELL2 are coupled to a same plate line, for example, plate line P/L1 or P/L2. Each of the second cells CELL2 can include a second cell selection transistor and the first ferroelectric capacitor C1.

A third cell CELL3 can be arranged between the second word line W/L2 and the bit line bar B/L/B. The third cell CELL3 can include a third cell selection transistor and a second ferroelectric capacitor C2.

Fourth cells CELL4 can be arranged between the third word line W/L3 adjacent the second word line W/L2 and the bit line bar B/L/B. Each of the fourth cells CELL4 can include a fourth cell selection transistor and the second ferroelectric capacitor C2.

In embodiments, the first ferroelectric capacitors C1 can be connected to the bit lines B/L, and the second ferroelectric capacitors C2 can be connected to the bit line bars B/L/B.

A first plate line P/L1 can be electrically connected to the upper electrodes of the first ferroelectric capacitors C1. The first plate line P/L1 can be arranged between the first word line W/L1 and the second word line W/L2. Because the first plate line P/L1 can be connected to the first ferroelectric capacitors C1, the first plate line P/L1 can be interlocked with the bit lines B/L.

In this example embodiment, when the first plate line P/L1 and the first word line W/L1 are operated, data can be output from the bit line B/L. Further, when the first plate line P/L1 and the second word line W/L2 are operated, data can be output from the bit line B/L. Thus, when the first plate line P/L1 and any one of the word lines connected to the first plate line P/L1 are operated, the data can be alternately output, because, in an embodiment, data cannot be output from the bit line bars B/L/B.

A second plate line P/L2 can be electrically connected to the upper electrodes of the second ferroelectric capacitors C2. The second plate line P/L2 can be arranged between the second word line W/L2 and the third word line W/L3. Because the second plate line P/L2 can be connected to the second ferroelectric capacitors C2, the second plate line P/L2 can be interlocked with the bit line bars B/L/B.

In this example embodiment, when the second plate line P/L2 and the second word line W/L2 are in operation, data can be output from the bit line bar B/L/B. Further, when the second plate line P/L2 and the third word line W/L3 are in operation, data can be output from the bit line bar B/L/B. Thus, when the second plate line P/L2 and any one of the word lines connected to the second plate line P/L2 are in operation, the data can be alternately output, because data can not be output from the bit lines B/L.

A sense amplifier S/A can be connected between a single bit line B/L and a single bit line bar B/L/B adjacent each other in one sector. That is, the sense amplifier S/A can amplify signals output from the bit line B/L and the bit line bar B/L/B adjacent each other to discriminate between states of data in a selected cell, i.e. between a programmed cell and an erased cell. Because data can be output from only one of the bit line B/L and the bit line bar B/L/B in accordance with selections of the plate lines, the data can be discriminated by the amplification of the signals output from the bit line B/L and the bit line bar B/L/B adjacent each other.

Thus, unlike conventional structures described herein in which two core sense amplifiers can be provided to the bit line and the bit line bar, the ferroelectric memory device in accordance with example embodiments can include one sense amplifier S/A coupled to two bit lines in one sector. Thus, because sense amplifiers S/A are not required for each of the bit lines, an area of a core region where the sense amplifier S/A can be formed can be sufficiently ensured.

Further, the bit line B/L and the bit line bar B/L/B connected to the same sense amplifier S/A can be located in one sector, so that the bit line B/L and the bit line bar B/L/B can have substantially the same electrical environment. Therefore, signals output from the ferroelectric memory device and amplified by the sense amplifier S/A can have high sensitivity. As a result, data in a selected cell can be accurately discriminated.

Figure 2:
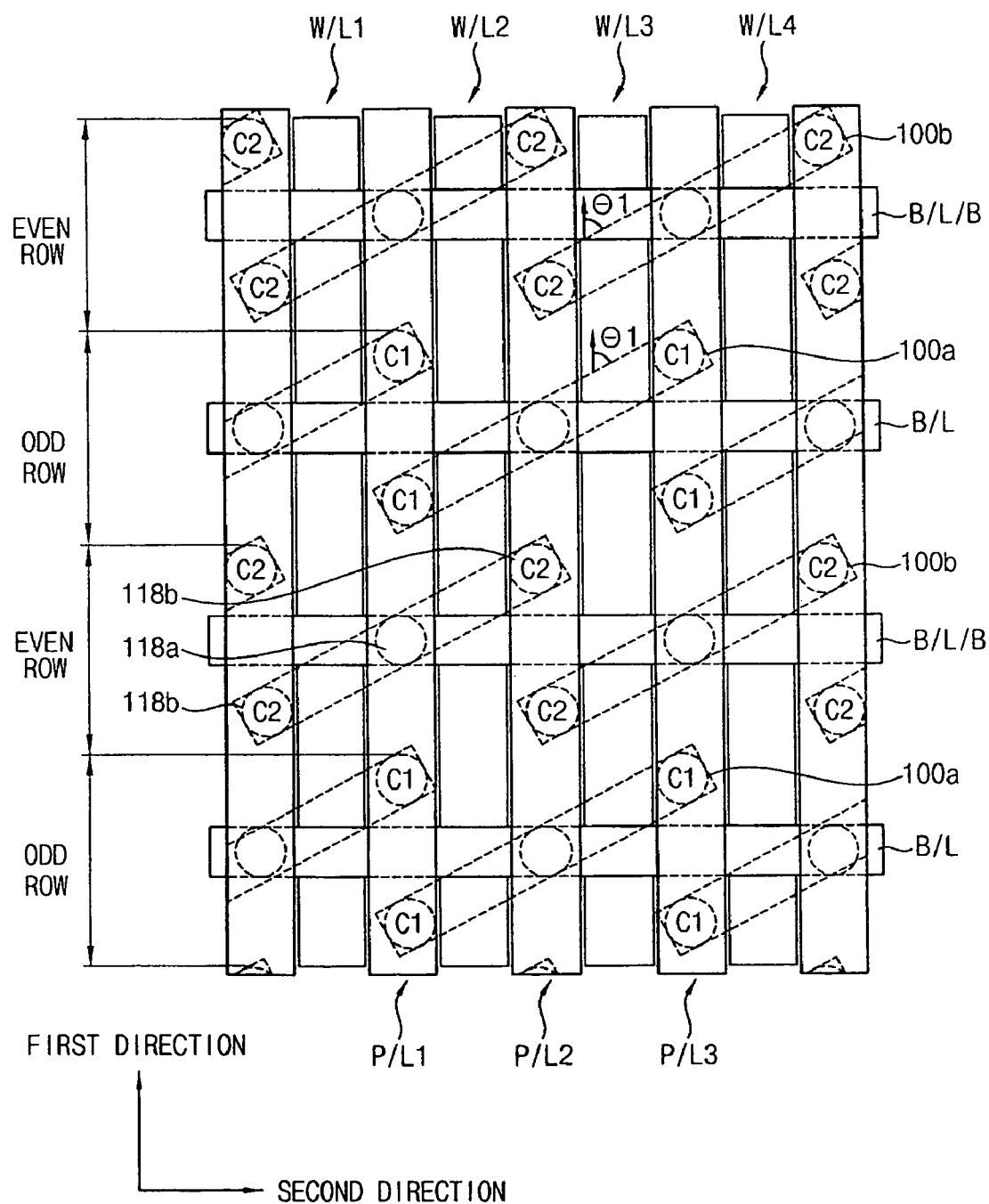
Figure 3:
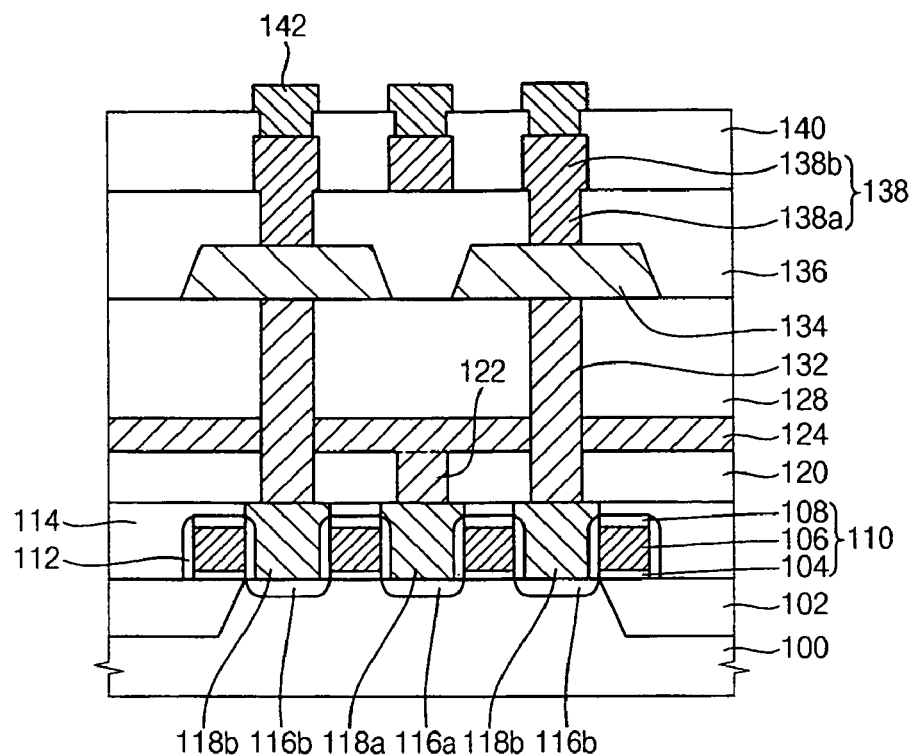

FIG. 2 is a plan view illustrating a FRAM device in accordance with some example embodiments, and FIG. 3 is a cross-sectional view illustrating a FRAM device in accordance with some example embodiments.

Referring to FIGS. 2 and 3, first active regions 100a and second active regions 100b can be formed on a semiconductor substrate 100. The first active regions 100a and the second active regions 100b can be repeatedly arranged on the semiconductor substrate 100. Further, the first active regions 100a and the second active regions 100b can have a shape that is defined by neighboring isolation regions. Accordingly, the first active regions 100a and the second active regions 100b can be surrounded by isolation regions.

In this example embodiment, the first active regions 100a can be arranged in an odd row. The first active regions 100a can be arranged at a first angle $\theta_1$ with respect to a first direction. Further, the first active regions 100a can be arranged to be parallel to each other.

The second active regions 100b can be arranged in an even row. The second active regions 100b can be arranged at the first angle $\theta_1$ with respect to the first direction. The second active regions 100b can have a shape substantially the same as that of the first active regions 100a. The first active regions 100a and the second active regions 100b can be alternately arranged, so that the first active regions 100a and the second active regions 100b do no intersect each other. In an embodiment, a first active region 100a and adjacent second active regions 100b are substantially parallel with each other. For example, an end of the second active regions 100b can be placed between ends of the adjacent first active regions 100a such that second active regions 100b do not intersect the adjacent first active regions 100a.

Word lines W/L1, W/L2, W/L3 and W/L4 can be formed on the first active regions 100a and the second active regions 100b. The word lines W/L1, W/L2, W/L3 and W/L4 can be arranged to be in parallel with each other. In FIG. 3, the word lines are labeled with a reference numeral 106. The word lines W/L1, W/L2, W/L3 and W/L4 (FIG. 2) or 106 (FIG. 3) can extend in the first direction. Gate insulating layers can be interposed between the first active regions 100a and the word lines W/L1, W/L2, W/L3 and W/L4 or 106, and between the second active regions 100b and the word lines W/L1, W/L2, W/L3 and W/L4 or 106. Thus, the word lines W/L1, W/L2, W/L3 and W/L4 or 106 can be used as gate electrodes in the first active regions 100a and the second active regions 100b.

Source/drain regions 116a and 116b are formed by being doped with impurities and can be formed at upper surfaces of the semiconductor substrate 100 at both sides of the word lines W/L1, W/L2, W/L3 and W/L4 or 106.

The word lines W/L1, W/L2, W/L3 and W/L4 or 106 can be covered with a first insulating interlayer 114. In some example embodiments, the first insulating interlayer 114 can include silicon oxide.

First contact plugs 118a and second contact plugs 118b can be formed in the first insulating interlayer 114. The first contact plugs 118a can make contact with the source regions 116a. The second contact plugs 118b can make contact with the drain regions 116b.

A second insulating interlayer 120 can be formed on the first insulating interlayer 114. A bit line contact 122 can be formed in the second insulating interlayer 120. The bit line contact 122 can be electrically connected to the first contact plugs 118a.

Bit lines B/L and bit line bars B/L/B can be formed on the second insulating interlayer 120. The bit lines B/L and the bit line bars B/L/B can be connected to the bit line contact 122. Here, the bit lines and the bit line bars are labeled with a reference numeral 124 in FIG. 3. The bit lines B/L can cross central portions of the first active regions 100a. Further, the bit lines B/L can extend in a second direction substantially perpendicular to the first direction. The bit line bars B/L/B can cross central portions of the second active regions 100b. The bit line bars B/L/B can extend in the second direction. The bit lines B/L and the bit line bars B/L/B can be alternately arranged.

The bit lines B/L and the bit line bars B/L/B can be covered with a third insulating interlayer 128. A lower electrode 132 of a ferroelectric capacitor can penetrate the third insulating interlayer 128 and the second insulating interlayer 120. The lower electrode 132 of the ferroelectric capacitor can be electrically connected to the second contact plugs 118b.

A ferroelectric layer pattern 134 can be formed on the third insulating interlayer 128. The ferroelectric layer pattern 134 can make contact with the lower electrode 132. In some example embodiments, the ferroelectric layer pattern 134 can include PZT, SBT, BLT, PLZT, BST, and the like. Alternatively, the ferroelectric layer pattern 134 can include PZT, SBT, BLT, PLZT, BST, and the like doped with calcium, lanthanum, manganese, bismuth, etc.

A fourth insulating interlayer 136 can be formed on the third insulating interlayer 128 to cover the ferroelectric layer pattern 134.

An upper electrode 138 of the ferroelectric capacitor can penetrate the fourth insulating interlayer 136. The upper electrode 138 can make contact with the ferroelectric layer pattern 134.

As mentioned above, the ferroelectric capacitor including the lower electrode 132, the ferroelectric layer pattern 134 and the upper electrode 138 can be formed on the second contact plugs 118b connected to the drain regions 116b. Here, the ferroelectric capacitors connected to the first active regions 100a in the odd row are referred to as first ferroelectric capacitors. The ferroelectric capacitors connected to the second active regions 100b in the even row are referred to as second ferroelectric capacitors. Further, in FIG. 2, a region labeled with C1 represents a region where the first ferroelectric capacitors are formed. A region labeled with C2 represents a region where the second ferroelectric capacitors are formed. Thus, the first ferroelectric capacitors C1 can be connected between the bit lines B/L and the word lines W/L1, W/L2, W/L3 and W/L4 or 106. The second ferroelectric capacitors C2 can be connected between the bit line bars B/L/B and the word lines W/L1, W/L2, W/L3 and W/L4 or 106.

A fifth insulating interlayer 140 can be formed on the fourth insulating interlayer 136 to cover the upper electrodes 138 of the ferroelectric capacitors.

A first plate line P/L1 can be formed on the fifth insulating interlayer 140. The first plate line P/L1 can make contact with the upper electrodes of the first ferroelectric capacitors. A second plate line P/L2 can be formed on the fifth insulating interlayer 140. The second plate line P/L2 can make contact with the upper electrodes of the second ferroelectric capacitors. The first plate line P/L1 and the second plate line P/L2 can be arranged between the word lines W/L1, W/L2, W/L3 and the W/L4. The first plate line P/L1 and the second plate line P/L2 can have a shape configured to extend in the first direction. In an embodiment as shown in FIG. 3, a plate pattern 142 can be formed on the fifth insulating interlayer 140 and can make contact with an upper electrode 138 of a ferroelectric capacitor.

A sense amplifier S/A (See FIG. 1) can be connected to an end of each of the bit lines B/L and an end of each of the bit line bars B/L/B adjacent to the bit line B/L. The sense amplifier S/A can be arranged in a core region corresponding to an edge portion of a sector where a cell can be formed. The sense amplifier S/A can include a plurality of transistors formed on the semiconductor substrate 100.

According to this example embodiment illustrated at FIGS. 2 and 3, the ferroelectric memory device can include the active regions inclined toward the first direction at an acute angle, for example $\theta_1$ shown in FIG. 2. Thus, the ferroelectric memory device can have a relatively wide interval between conductive patterns compared to that of a conventional ferroelectric memory device that includes active regions arranged along the first direction in view of formations of contact plugs and wirings. However, a parasitic capacitance caused by the bit lines, i.e., a capacitance between the bit lines, a capacitance between the bit line and the word line, a capacitance between the bit line and the contact plug, a capacitance between the bit line and the upper conductive pattern, etc., can be remarkably decreased. The decreased parasitic capacitance can induce an improved sensing margin in reading data, so that malfunctions caused by sensing noises can be reduced.

Further, the ferroelectric memory device can be operated in a manner substantially similar to that of a folded bit line structure, where data can be output from any one of the bit line B/L and the bit line bar B/L/B. On the other hand, the ferroelectric memory device illustrated in the abovementioned embodiments does not operate in a manner similar to that of an open bit line structure, where data is output from both the bit line and the bit line bar, in reading operations with the structure where unit elements can be formed in the active regions inclined to the first direction. Therefore, only one sense amplifier is connected to one bit line and one bit line bar in one sector, so that a layout of the core region can be simplified.

FIGS. 4 to 8 are cross-sectional views illustrating a method of manufacturing a FRAM device in accordance with some example embodiments.

Figure 4:
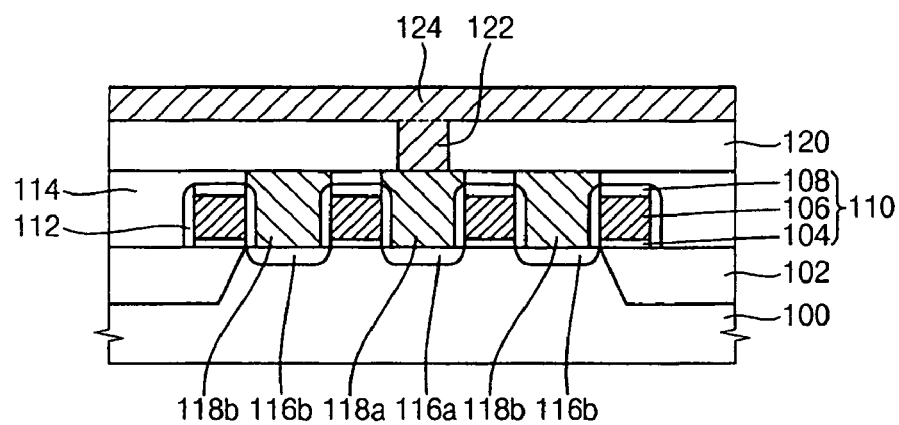

Referring to FIG. 4, a shallow trench isolation (STI) process can be performed on a semiconductor substrate 100 to form a plurality of isolation layer patterns 102. The isolation layer patterns 102 can define first active regions, second active regions, and field regions, for example, as illustrated in FIG. 2. The first active regions and the second active regions can have an isolated shape. Further, the first active regions and the second active regions can be alternately arranged. The field regions can surround the first active regions and the second active regions.

In this example embodiment, the first active regions can be repeatedly arranged in an odd row. Further, the first active regions can be arranged at a first angle with respect to a first direction. The second active regions can be arranged in an even row. Here, because the second active regions and the first active regions can be alternately arranged, the first active regions and the second active regions do not intersect each other. Further, the second active regions can have a shape substantially the same as that of the first active regions. The second active regions can likewise be arranged at the first angle with respect to the first direction. That is, the first active regions and the second active regions can be inclined to the first direction by substantially the same angle.

The semiconductor substrate 100 can be thermally oxidized to form a gate insulating layer (not shown). A conductive layer (not shown) and a hard mask pattern 108 can be sequentially formed on the gate insulating layer and the isolation layer patterns 102. The conductive layer and the gate insulating layer can be patterned by a photolithography process to form a gate insulating layer pattern 104 and word lines 106. In this example embodiment, the word lines 106 can have a linear shape that extends in the first direction. Further, each of the two word lines 106 can be arranged in parallel with each other on the isolated first active regions and the isolated second active regions, respectively. Thus, two selection transistors can be formed in the first active regions and the second active regions, respectively.

Impurities can be implanted into upper surfaces of the semiconductor substrate 100 at both sides of each word lines 106 to form source/drain regions 116a and 16b.

Although not depicted in drawings, transistors of a sense amplifier can be formed in a core region corresponding to an interface region between sectors where cells of a ferroelectric memory device can be formed.

A first insulating interlayer 114 can be formed on the semiconductor substrate 100 to cover the word lines 106. In this example embodiment, the first insulating interlayer 114 can include silicon oxide.

The first insulating interlayer 114 can be partially removed by a photolithography process to form a first contact hole configured to expose upper surfaces of the source/drain regions 116a and 116b.

The first contact hole can be filled with a conductive material. The conductive material can be planarized until an upper surface of the first insulating interlayer 114 is exposed to form a first contact plug 118a and a second contact plug 118b. The first contact plug 118a can make contact with the source region 116a. The second contact plug 118b can make contact with the drain region 116b.

A second insulating interlayer 120 can be formed on the first insulating interlayer 114, the first contact plug 118a and the second contact plug 118b. The second insulating interlayer 120 can be partially removed by a photolithography process to form a second contact hole configured to expose the first contact plug 118a.

A conductive layer can be formed on the second insulating interlayer 120 to fill up the second contact hole. The conductive layer can be patterned to form a bit line contact 122 and a bit line pattern 124. In this example embodiment, the bit line pattern 124 can have a linear shape extending in a second direction that is substantially perpendicular to the first direction. Further, the bit line pattern 124 can serve as at least one of a bit line and a bit line bar through which bit signals of the ferroelectric memory device can be inputted/outputted.

Here, a portion of the bit line pattern 124, which can cross central portions of the first active regions and can extend in a direction substantially perpendicular to the first direction, can serve as the bit line. In contrast, a portion of the bit line pattern 124, which can cross central portions of the second active regions and can extend in a direction substantially perpendicular to the first direction can serve as the bit line bar.

Figure 5:
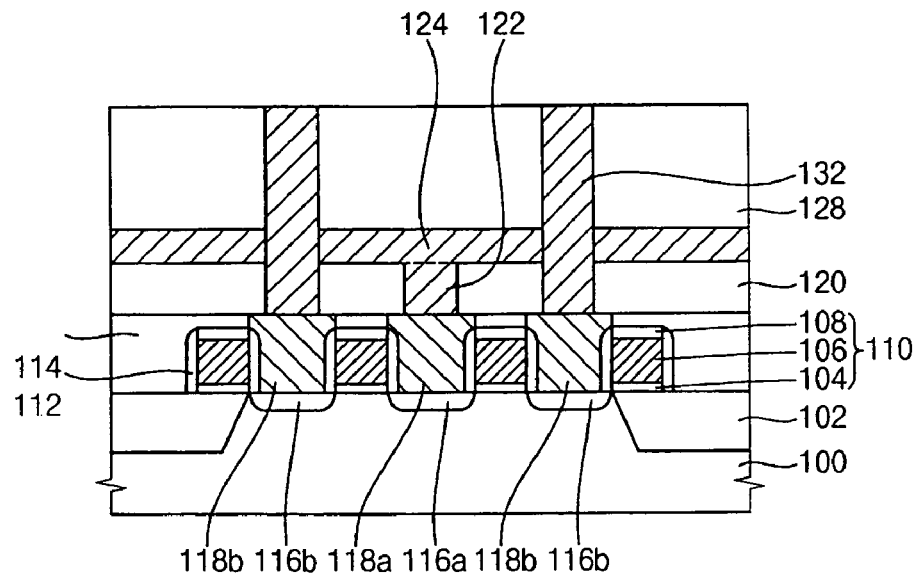

Referring to FIG. 5, the bit line pattern 124 can be covered with a third insulating interlayer 128. In some example embodiments, the third insulating interlayer 128 can include silicon oxide such as BPSQ, PSG, SOG, PE-TEOS, USG, HDP-CVD oxide, and the like.

The third insulating interlayer 128 can be partially removed by a photolithography process to form a third contact hole configured to expose the second contact plug 118b.

The third contact hole can be filled with a conductive layer (not shown). In some example embodiments, the conductive layer can include iridium, platinum, ruthenium, palladium, gold, platinum-manganese, iridium-ruthenium, iridium oxide, strontium ruthenium oxide, strontium titanium oxide, lanthanum nickel oxide, calcium ruthenium oxide, and the like.

The conductive layer can be planarized by a chemical mechanical polishing (CMP) process until an upper surface of the third insulating interlayer 128 can be exposed to form a lower electrode 132 of a ferroelectric capacitor.

Figure 6:
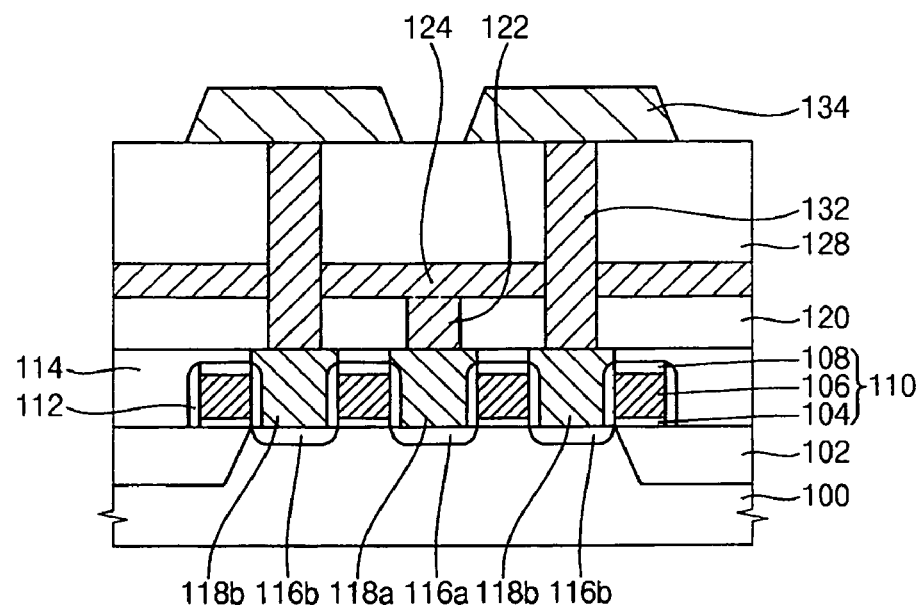

Referring to FIG. 6, a ferroelectric layer (not shown) can be formed on the lower electrode 132 and the third insulating interlayer 128. In some example embodiments, the ferroelectric layer can be formed by a metal organic chemical vapor deposition (MOCVD) process, a sol-gel process, an atomic layer deposition (ALD) process, a chemical vapor deposition (CVD) process, etc. Further, the ferroelectric layer can include PZT, SBT, BLT, PLZT, BST, and the like. Alternatively, the ferroelectric layer can include PZT, SBT, BLT, PLZT, BST, and the like doped with calcium, lanthanum, manganese, bismuth, etc.

In this example embodiment, the PZT can be deposited on the lower electrode 132 and the third insulating interlayer 128 by the MOCVD process to form the ferroelectric layer.

The ferroelectric layer can be patterned to form a ferroelectric layer pattern 134 making contact with the lower electrode 132.

Figure 7:
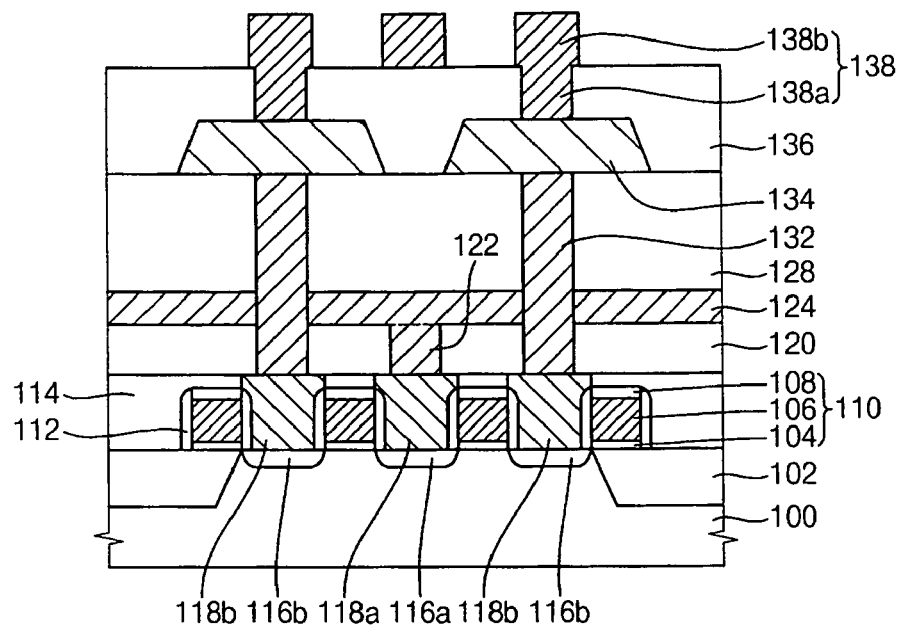

Referring to FIG. 7, a fourth insulating interlayer 136 can be formed on the third insulating interlayer 128 to cover the ferroelectric layer pattern 134. Thus, a gap between the ferroelectric layer patterns 134 can be filled with the fourth insulating interlayer 136. In some example embodiments, the fourth insulating interlayer 136 can be formed by a CVD process using silicon oxide.

The fourth insulating interlayer 136 can be partially etched to form a fourth contact hole configured to partially expose an upper surface of the ferroelectric layer pattern 134. The fourth contact hole can be filled with a conductive layer (not shown). Here, the conductive layer in the fourth contact hole can serve as an upper electrode of the ferroelectric capacitor by following processes. In some example embodiments, the conductive layer can include iridium oxide, iridium, etc.

Particularly, an iridium oxide layer can be formed on an inner surface of the fourth contact hole. An iridium layer can be formed on the iridium oxide layer to fill the fourth contact hole. Here, the iridium oxide layer can function to reinforce an interface of adhesive strength between the ferroelectric layer pattern 134 and the iridium layer and to reduce stresses of the iridium layer.

The conductive layer can be patterned by a photolithography process to form the upper electrode 138 of the ferroelectric capacitor. The upper electrode 138 can make contact with the ferroelectric layer pattern 134. The upper electrode 138 can include an upper electrode contact 138a in the fourth contact hole, and an additional upper electrode 138b upwardly extending from the upper electrode contact 138a and horizontally extending in the first direction.

By the abovementioned processes, the ferroelectric capacitors connected to the drain region 116b can be completed. Here, the ferroelectric capacitors connected to the first active regions in the odd row are referred to as first ferroelectric capacitors. The ferroelectric capacitors connected to the second active regions in the even row are referred to as second ferroelectric capacitors. That is, the first ferroelectric capacitors can be connected between the bit lines and the word lines. The second ferroelectric capacitors can be connected between the bit line bars and the word lines.

Figure 8:
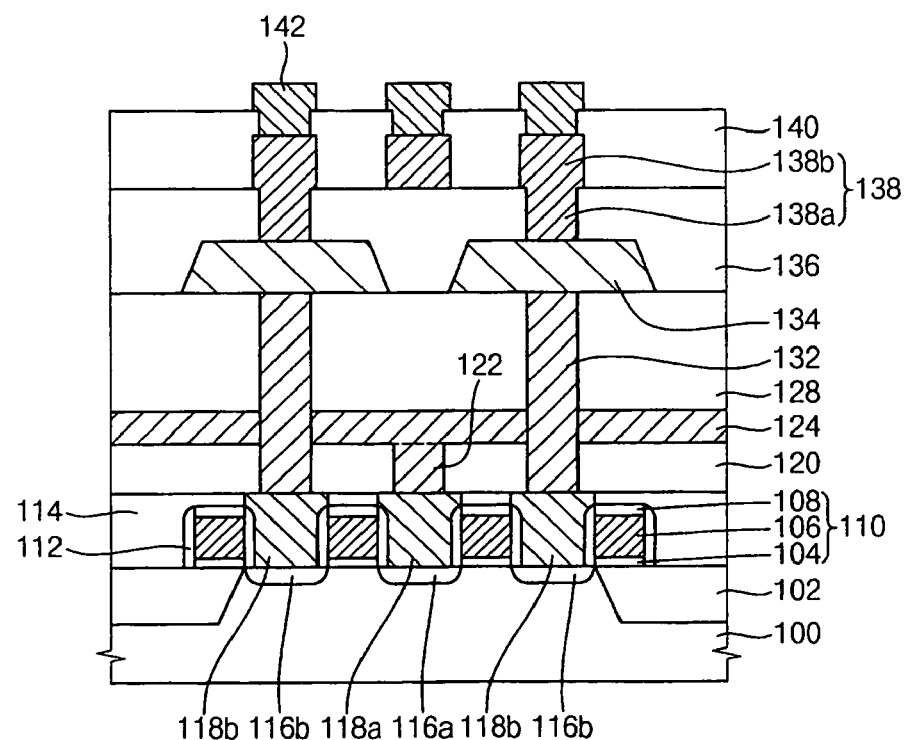

Referring to FIG. 8, the upper electrodes 138 can be covered with a fifth insulating interlayer 140.

The fifth insulating interlayer 140 can be partially removed to form a fifth contact hole configured to expose the upper electrodes 138. A conductive layer (not shown) can be formed on the fifth insulating interlayer 140 to fill up the fifth contact hole. The conductive layer can be patterned to form plate patterns 142 making contact with the upper electrodes 138. In this example embodiment, each of the plate patterns 142 can be arranged between the word lines. Further, the plate patterns 142 can have a linear shape extending in the first direction. In an embodiment, the plate patterns 142 and the word lines 106 extend in the same direction, for example, the first direction.

The plate pattern 142 can include a first plate line configured to make contact with the upper electrodes 138 of the first ferroelectric capacitors on the fifth insulating interlayer 140. Further, the plate pattern 142 can be configured to make contact with the upper electrodes 138 of the second ferroelectric capacitors on the fifth insulating interlayer 140.

Additionally, a sense amplifier can be formed in the core region of the semiconductor substrate 100. In some example embodiments, transistors of the sense amplifier can be formed in the core region together with the formation of the selection transistors. Further, contacts can be connected between the transistors of the sense amplifier together with the formation of the contacts. Here, one sense amplifier in the core region can be provided to the bit line and the bit line bar in one sector.

According to some example embodiments, the ferroelectric memory device can have an increased sensing margin and a simple layout. Further, the method can be applicable for manufacturing a highly integrated ferroelectric memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A ferroelectric random access memory (FRAM) device comprising:

first, second and third word lines extending in a first direction;

a first plate line extending in the first direction between the first and second word lines;

a second plate line extending in the first direction between the second and third word lines;

first memory cells including first ferroelectric capacitors, the first memory cells connected between the first word line and bit lines, and connected between the second word line and the bit lines;

second memory cells including second ferroelectric capacitors, the second memory cells connected between the second word line and bit line bars, and connected between the third word line and the bit line bars;

wherein the first plate line is connected to upper electrodes of the first ferroelectric capacitors; and wherein the second plate line is connected to upper electrodes of the second ferroelectric capacitors.

2. The FRAM device of claim 1, wherein the bit lines and the bit line bars are alternately arranged.

3. The FRAM device of claim 1, wherein the first and second memory cells further include cell selection transistors connected between the word lines and the bit lines, and between the word lines and the bit line bars.

4. The FRAM device of claim 3, wherein the word lines are used as gate electrodes of the cell selection transistors.

5. The FRAM device of claim 3, wherein the first ferroelectric capacitors and the second ferroelectric capacitors are connected to drain regions of the cell selection transistors, and wherein the bit lines and the bit line bars are connected to source regions of the cell selection transistors.

6. The FRAM device of claim 1, wherein the bit lines comprise first and second bit lines, the first and second bit lines extending in a second direction that is perpendicular to the first direction, and wherein the bit line bars comprise first and second bit line bars, the first and second bit line bars extending in the second direction.

7. The FRAM device of claim 6, wherein the first bit line bar extends in the second direction between the first bit line and the second bit line.

8. The FRAM device of claim 1, further comprising at least one sense amplifier connected to one bit line and one bit line bar that are adjacent each other.

* * * * *